United States Patent
Kim et al.

(10) Patent No.: US 9,379,304 B2
(45) Date of Patent: Jun. 28, 2016

(54) INTERNAL ELECTRODE FOR PIEZOELECTRIC DEVICE, PIEZOELECTRIC DEVICE INCLUDING THE SAME, AND METHOD FOR MANUFACTURING PIEZOELECTRIC DEVICE

(71) Applicant: Samsung Electro-Mechanics, Co., Ltd., Suwon, Gyunggi-do (KR)

(72) Inventors: Boum Seock Kim, Gyunggi-do (KR); Jung Wook Seo, Gyunggi-do (KR)

(73) Assignee: SAMSUNG ELECTRO-MECHANICS CO., LTD., Suwon-Si, Gyeonggi-Do (KR)

(*) Notice: Subject to any disclaimer, the term of this patent is extended or adjusted under 35 U.S.C. 154(b) by 472 days.

(21) Appl. No.: 14/029,609

(22) Filed: Sep. 17, 2013

(65) Prior Publication Data

US 2014/0368091 A1 Dec. 18, 2014

(30) Foreign Application Priority Data

Jun. 13, 2013 (KR) .................. 10-2013-0067869

(51) Int. Cl.
| | |
|---|---|
| H01L 41/083 | (2006.01) |
| H01L 41/047 | (2006.01) |
| H01L 41/293 | (2013.01) |
| H01L 41/273 | (2013.01) |

(52) U.S. Cl.
CPC .......... *H01L 41/0474* (2013.01); *H01L 41/047* (2013.01); *H01L 41/273* (2013.01); *H01L 41/293* (2013.01); *Y10T 29/42* (2015.01)

(58) Field of Classification Search
USPC .................. 310/311–370; 29/25.35
See application file for complete search history.

(56) References Cited

U.S. PATENT DOCUMENTS

| | | | | |
|---|---|---|---|---|
| 2004/0011134 | A1* | 1/2004 | Sato | B06B 1/064 73/632 |
| 2010/0207194 | A1* | 8/2010 | Tanaka | H01L 27/11578 257/324 |
| 2010/0276743 | A1* | 11/2010 | Kuniya | H01L 27/115 257/315 |
| 2011/0008056 | A1* | 1/2011 | Yagisawa | G02B 6/4201 398/182 |
| 2011/0156539 | A1 | 6/2011 | Park et al. | |
| 2013/0118568 | A1* | 5/2013 | Ohmi | H01L 31/022483 136/255 |

FOREIGN PATENT DOCUMENTS

| | | |
|---|---|---|
| KR | 10-2012-0013273 A | 2/2012 |
| KR | 10-2012-0027915 A | 3/2012 |

* cited by examiner

*Primary Examiner* — Thomas Dougherty
(74) *Attorney, Agent, or Firm* — McDermott Will & Emery LLP

(57) ABSTRACT

There is provided a piezoelectric device, including: a multi-layered body in which a piezoelectric layer having a first internal electrode formed thereon and a piezoelectric layer having a second internal electrode formed thereon are alternately formed; a first insulating via formed in the first internal electrode layer; a second insulating via formed in the second internal electrode layer; a first conductive via formed in the multilayered body and penetrating through the first insulating via; and a second conductive via formed in the multilayered body and penetrating through the second insulating via, wherein a diameter of the first insulating via is larger than a diameter of the first conductive via, and a diameter of the second insulating via is larger than a diameter of the second conductive via.

18 Claims, 8 Drawing Sheets

INTERNAL ELECTRODE FOR PIEZOELECTRIC DEVICE, PIEZOELECTRIC DEVICE INCLUDING THE SAME, AND METHOD FOR MANUFACTURING PIEZOELECTRIC DEVICE

CROSS-REFERENCE TO RELATED APPLICATIONS

This application claims the priority of Korean Patent Application No. 10-2013-0067869 filed on Jun. 13, 2013, in the Korean Intellectual Property Office, the disclosure of which is incorporated herein by reference.

BACKGROUND OF THE INVENTION

1. Field of the Invention

The present invention relates to an internal electrode for a piezoelectric device having a large effective area, a piezoelectric device including the same, and a method for manufacturing a piezoelectric device.

2. Description of the Related Art

Recently, in mobile electronic devices such as mobile phones, mobile game consoles and e-books, vibrations have been used to silently notify a user of an incoming call as well as to provide a feedback signal to a user in the case of touch input devices.

As a component for generating vibrations, a piezoelectric device having a response speed faster than that of existing vibration motors and operable at various frequencies is being used.

A piezoelectric device is a device using the piezoelectric effect, i.e., an effect in which electrical polarization occurs in response to applied external pressure so that a potential difference occurs, and in reverse, mechanical deformation or mechanical stress is generated in response to voltage applied thereto.

Piezoelectric devices (elements) are manufactured using materials having an excellent degree of piezoelectricity such as crystal, tourmaline, Rochelle salts, barium titanate, monoammonium phosphate or tartaric acid ethylene diamine.

A piezoelectric device, as a vibration generating device, generates vibrations using mechanical deformation or mechanical stress generated in response to voltage applied thereto.

In order to amplify the mechanical deformation or mechanical stress generated in such piezoelectric devices, a plurality of thin film piezoelectric layers, in which internal electrodes are formed, may be stacked, to produce stronger vibrations.

That is, in piezoelectric devices manufactured by stacking a plurality of thin film piezoelectric layers in which internal electrodes are formed, an electrical field is formed between two electrodes in response to an applied voltage so that mechanical deformation of the structure is caused by dipoles generated in the piezoelectric layers.

By doing so, mechanical strain may result from the deformation in the structure, thereby generating vibrations.

Since the strain of the piezoelectric device increases proportionally to an applied electrical field, a higher amount of voltage is to be applied between electrodes in order to obtain a higher degree of strain.

Since such a higher operating voltage may cause serious problems in a circuit, a piezoelectric device may instead be manufactured such that a plurality of piezoelectric layers are stacked on one another to reduce thickness between the electrodes and thus a larger electrical field may be applied under the conditions of the same voltage, thereby obtaining a higher degree of mechanical deformation.

For instance, if the same amount of voltage is applied to a piezoelectric device having a single layer and to a piezoelectric device having a plurality of layers, a higher degree of strain may be obtained in the latter, as compared to the former.

In multilayered piezoelectric devices, internal electrodes formed in the piezoelectric layers having opposite polarities are alternately stacked on one another in the stacking direction.

To this end, for example, internal electrodes to which a positive voltage is applied are printed such that they are left-sided in the piezoelectric layers to create space, and internal electrodes to which a negative voltage is applied are printed such that they are right-sided in the piezoelectric layers to create space, then the layers are stacked, pressed and fired, and then via holes are formed in the space portion so as to be electrically connected to piezoelectric layers having opposite polarities.

That is, since internal electrodes having opposite polarities are stacked such that they are staggered, the space, in which via holes to electrically connect the internal electrodes to the outside are formed, remains as an inactive region.

Such an inactive region causes the performance of a piezoelectric device to deteriorate when an electrical field is applied to the piezoelectric device to generate strain.

Accordingly, a method for minimizing an inactive region of a piezoelectric device is required.

Patent Document 1 below relates to a piezoelectric actuator for driving a haptic device.

Specifically, Patent Document 1 discloses a piezoelectric actuator for driving a haptic device that includes a piezoelectric body in which a plurality of piezoelectric layers having the same poling direction are stacked; and electrode patterns formed on the piezoelectric body, wherein the length of each of the piezoelectric layers is four times that of the width of the piezoelectric layers or more, and the width of the piezoelectric layers is ten times the thickness of the piezoelectric layers or more.

However, in the piezoelectric actuator disclosed in Patent Document 1, external electrodes are formed on one side of the piezoelectric actuator so that elements corresponding to the conductive vias and insulating vias disclosed in the present invention are not discussed, and thus the feature of minimizing an inactive region of the piezoelectric device is not disclosed.

RELATED ART DOCUMENT (Patent Document 1) Korean Patent Laid-open Publication No. 2012-0013273

SUMMARY OF THE INVENTION

An aspect of the present invention provides an internal electrode for a piezoelectric device capable of minimizing an inactive region.

An aspect of the present invention also provides a piezoelectric device having maximized performance using the internal electrodes, and a method for manufacturing the piezoelectric device.

According to an aspect of the present invention, there is provided a an internal electrode for a piezoelectric device, including: a piezoelectric layer; the internal electrode formed on the piezoelectric layer; an insulating via formed in the internal electrode; and a conductive via formed in the central portion of the insulating via, wherein a diameter of the insulating via is larger than a diameter of the conductive via.

The ratio of the diameter of the conductive via to the diameter of the insulating via may range from 0.5 to 0.75.

The internal electrode may further include an insulating layer formed around the insulating via.

The insulating layers may be made of a ferroelectric material including at least one element among Pb, Zr, and Ti.

The insulating via may at least be formed on one of one side of the internal electrode in the longitudinal direction thereof, one side of the internal electrode in the width direction thereof or in a corner thereof.

According to another aspect of the present invention, there is provided a piezoelectric device, including: a multilayered body in which a piezoelectric layer having a first internal electrode formed thereon and a piezoelectric layer having a second internal electrode layer formed thereon are alternately formed; a first insulating via formed in the first internal electrode layer; a second insulating via formed in the second internal electrode layer; a first conductive via formed in the multilayered body and penetrating through the first insulating via; and a second conductive via formed in the multilayered body and penetrating through the second insulating via, wherein a diameter of the first insulating via is larger than a diameter of the first conductive via, and a diameter of the second insulating via is larger than a diameter of the second conductive via.

The ratio of the diameter of the first conductive via to the diameter of the first insulating via may range from 0.5 to 0.75 or a ratio of the diameter of the second conductive via to the diameter of the second insulating via may range from 0.5 to 0.75.

The device may further include an insulating layer formed around the first insulating via or the second insulating via.

The insulating layer may be made of the same material as that of the piezoelectric layer.

The insulating layers may be made of a ferroelectric material including at least one element among Pb, Zr, and Ti.

The percentage of an overlapping area of the first internal electrode layer and the second internal electrode layer may be from 80 to 99%.

The first and second conductive vias may be filled with a conductive material.

According to another aspect of the present invention, there is provided a method of manufacturing a piezoelectric device, including: preparing a plurality of piezoelectric layers; printing a first internal electrode having a first insulating via formed therein on some of the piezoelectric layers, and printing a second internal electrode having a second insulating via formed therein on the other of the piezoelectric layers; preparing a multilayered body by alternately stacking the piezoelectric on which the first internal electrode is printed and the piezoelectric on which the second internal electrode is printed; pressing and firing the multilayered body; and forming a first conductive via in the multilayered body such that it penetrates through the first insulating via, and forming a second conductive via in the multilayered body such that it penetrates through the second insulating via, wherein a diameter of the first insulating via is larger than a diameter of the first conductive via, and a diameter of the second insulating via is larger than a diameter of the second conductive via.

The printing of the first and second internal electrode layers may include forming insulating layers around the first and second insulating vias.

The insulating layer may be made of the same material as that of the piezoelectric layer.

The insulating layers may be made of a ferroelectric material including at least one element among Pb, Zr, and Ti.

The method may further include, after the forming of the first and second conductive vias, forming a first external electrode connected to the first conductive via, and, forming a second external electrode connected to the second conductive via.

The ratio of the diameter of the first conductive via to the diameter of the first insulating via may range from 0.5 to 0.75 or a ratio of the diameter of the second conductive via to the diameter of the second insulating via may range from 0.5 to 0.75.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1A:
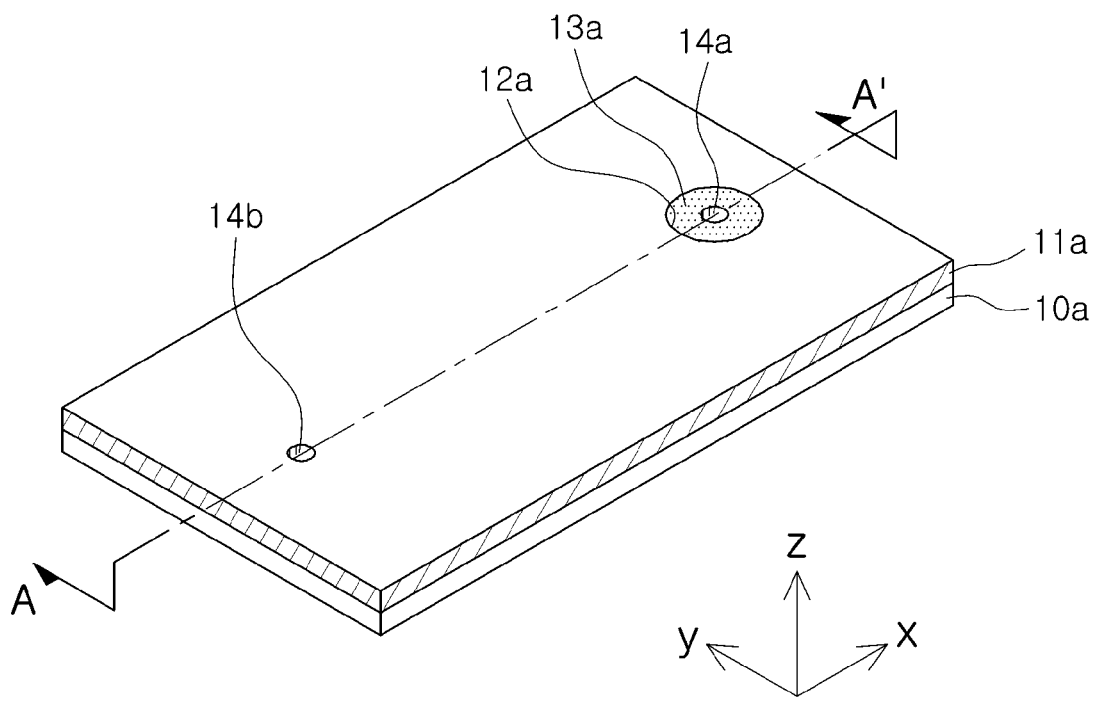
FIGS. 1A and 1B are perspective views schematically illustrating internal electrodes for a piezoelectric device according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 1B:
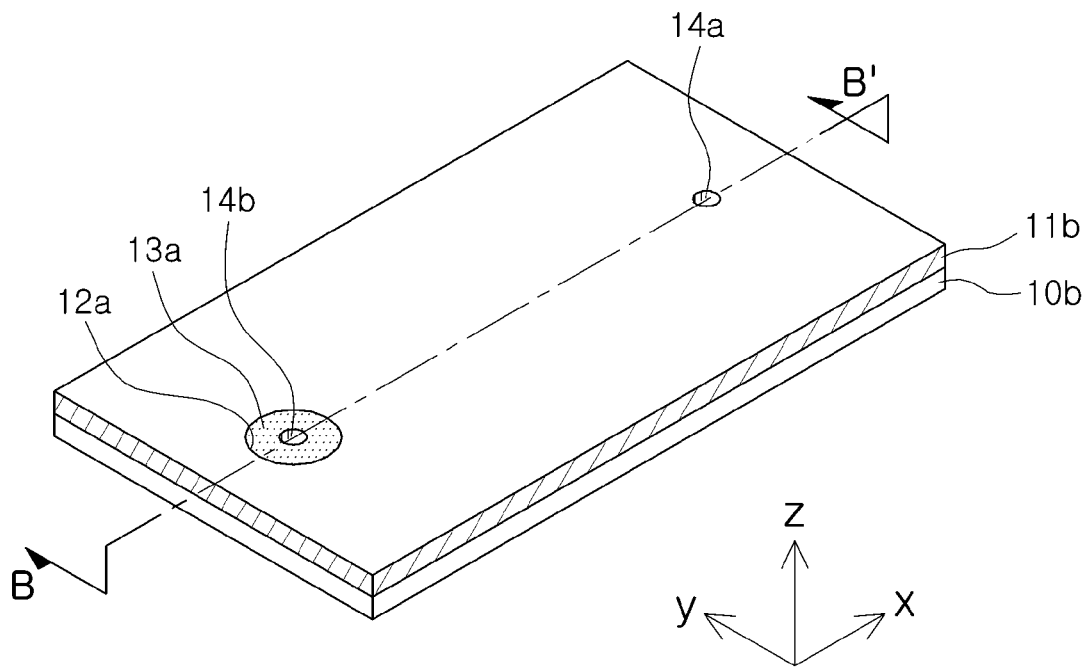
Figure 2A:
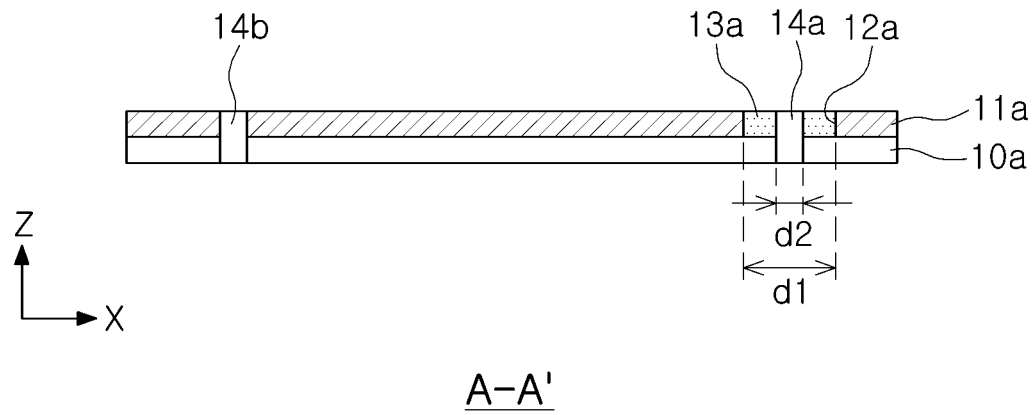
FIGS. 2A and 2B are schematic cross-sectional views taken along line A-A' in FIG. 1A and line B-B' in FIG. 1B, respectively.
Figure 2B:
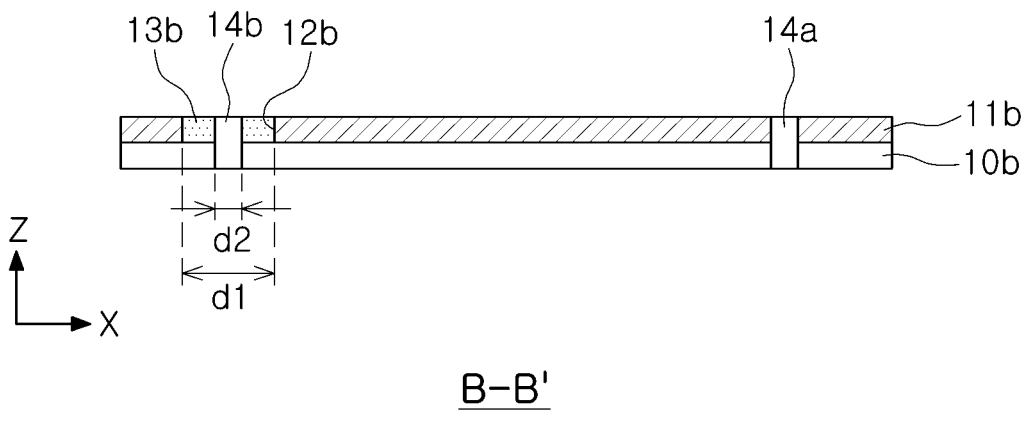

FIGS. 1A and 1B are perspective views schematically illustrating internal electrodes for a piezoelectric device according to an embodiment of the present invention; and FIGS. 2A and 2B are schematic cross-sectional views taken along line A-A' in FIG. 1A and line B-B' in FIG. 1B, respectively.

Referring to FIGS. 1A and 1B and FIGS. 2A and 2B, the internal electrodes for a piezoelectric device according to an embodiment of the present invention include internal electrode layers 11a and 11b formed on piezoelectric layers 10a and 10b, respectively.

Specifically, referring to FIG. 1A, the internal electrode according to an embodiment of the present invention may include a piezoelectric layer 10a; an internal electrode layer 11a formed on the piezoelectric layer 10a; an insulating via 12a formed in the internal electrode layer; and a conductive via 14a formed in the central portion of the insulating via, wherein the diameter d1 of the insulating via 12a is larger than the diameter d2 of the conductive via 14a.

Alternately, if an internal electrode has a polarity opposite to that of the above-described internal electrode, referring to FIG. 1B, the internal electrode according to the embodiment of the present invention may include a piezoelectric layer 10b; an internal electrode layer 11b formed on the piezoelectric layer 10b; an insulating via 12b formed in the internal electrode layer; and a conductive via 14b formed in the central portion of the insulating via, wherein the diameter d1 of the insulating via 12b is larger than the diameter d2 of the conductive via 14b.

The piezoelectric layers 10a and 10b may be made of material which exhibits the piezoelectric effect.

The piezoelectric effect means the property in which electric polarization occurs in response to applied external pressure so that a potential difference occurs, and in reverse, mechanical deformation or mechanical stress is generated in response to an applied voltage.

The piezoelectric layers 10a and 10b may be at least one selected from a group consisting of crystal, tourmaline, Rochelle salt, barium titanate, monoammonium phosphate, tartaric acid ethylene diamine or the like, or a mixture thereof.

The internal electrode layers 11a and 11b may be formed using a conductive paste.

The conductive paste may be produced using a metal powder having an excellent degree of conductivity, such as copper (Cu), silver (Ag) or gold (Au).

Typically, the internal electrode layers 11a and 11b need to be electrically connected to the outside to allow an electrical field to be applied to the piezoelectric layers 10a and 10b, and accordingly, parts of the internal electrode layers 11a and 11b need to be exposed to the outside to be connected to external electrodes.

In addition, in order to generate mechanical deformation or mechanical stress by applying opposing voltages to the piezoelectric layers 10a and 10b so as to induce dipoles, the internal electrode layers 11a and 11b have to be staggered.

Typically, the internal electrode layers 11a and 11b having opposite polarities are staggered, and electrical fields having opposing polarities are not applied to the staggered portions, so that the staggered portions cannot serve as active regions for increasing the performance of the piezoelectric device.

That is, the staggered portions of the internal electrode layers 11a and 11b are wasted as inactive regions.

Referring to FIG. 1A, the internal electrodes for a piezoelectric device according to the embodiment of the present invention are electrically connected to the outside using a conductive via 14b.

In this regard, the internal electrodes are only connected to one of positive or negative external electrodes to function as a piezoelectric device.

Accordingly, the internal electrodes for a piezoelectric device according to the embodiment of the present invention, a conductive via 14b via which the internal electrodes and one external electrodes are electrically connected, and a conductive via 14a formed in the central portion of an insulating via 12a may be formed.

That is, the diameter of the insulating via 12a may be larger than the diameter of the conductive via 14a formed in the central portion of the insulating via 12a so as to not be electrically connected to the internal electrode layer 11a.

That is, since the diameter d1 of the insulating via 12a is larger than the diameter d2 of the conductive via 14a, the conductive via 14a and the internal electrode layer 11a are not electrically connected.

The ratio d2/d1 of the diameter d2 of the conductive via 14a to the diameter d1 of the insulating via 12a may be 0.5 to 0.75.

Table 1 below shows the performance and reliability of a piezoelectric device depending on the value of d2/d1.

In the case that the performance of a piezoelectric device is 1 when no inactive region exists, O denotes that the performance of the piezoelectric device is 85% or greater and X denotes that the performance of the piezoelectric device is below 85%.

The reliability of the piezoelectric device is denoted as X if at least one sample out of 100 samples has a short-circuit, and Y if no short-circuit is found.

TABLE 1

| Sample No. | d2/d1 | performance | reliability |
|---|---|---|---|
| 1* | 0.40 | X | O |
| 2* | 0.45 | X | O |
| 3 | 0.50 | O | O |
| 4 | 0.55 | O | O |
| 5 | 0.60 | O | O |
| 6 | 0.65 | O | O |
| 7 | 0.70 | O | O |
| 8 | 0.75 | O | O |
| 9* | 0.80 | O | X |
| 10* | 0.85 | O | X |

*Comparative Example

As can be seen from Table 1, the performance of the piezoelectric device decreased below 85% when d2/d1 was below 0.05.

When d2/d1 exceeded 0.75, although the performance of the piezoelectric device was 85% or greater, a conductive material such as silver (Ag) contained in the internal electrode layer 11a is moved by the applied electrical field, so that a short-circuit may occur between the conductive via 14a and the internal electrode layer 11a due to the moved conductive material.

Consequently, when the d2/d1 was between 0.50 and 0.75, the performance of the piezoelectric device was 85% or greater, such that no short-circuits occurred and excellent performance and reliability were achieved.

Referring to FIG. 1A, an insulating layer 13a may be formed around the insulating via 12a.

Typically, a piezoelectric device is manufactured by stacking and pressing plural internal electrodes for a piezoelectric device and then firing them.

Here, when stacking and pressing the internal electrodes to manufacture a multilayered body, a step difference is made between the insulating via 12a and the internal electrode layer 11a.

Such a step difference contributes to cracks in the multilayered body, and conductive material is introduced into the cracks so that the reliability of a piezoelectric device may be lowered.

Therefore, in order to prevent cracks during the stacking and pressing, insulating layers 13a and 13b may be formed around the insulating vias 12a and 12b.

If applicable, the corresponding descriptions in FIGS. 1A and 2A apply to FIGS. 1B and 2B.

The insulating layers 13a and 13b may be made of a ferroelectric material including at least one element among Pb, Zr, and Ti.

Since the insulating layers 13a and 13b are made of ferroelectric material, it may be possible to minimize the performance loss of the piezoelectric device by forming the insulating vias 12a and 12b.

In addition, when the insulating layers 12a and 12b are made of the same material as the piezoelectric layers 10a and 10b of the piezoelectric device, during firing of a multilayered body, delamination due to the difference in thermal expansion coefficients of the materials may be prevented.

That is, by way of preventing delamination, the reliability of the piezoelectric device may be improved.

FIGS. 3A and 3B, 4A and 4B, and 5A and 5B are plan views of internal electrodes for a piezoelectric device according to an embodiment of the present invention.

Figure 3A:
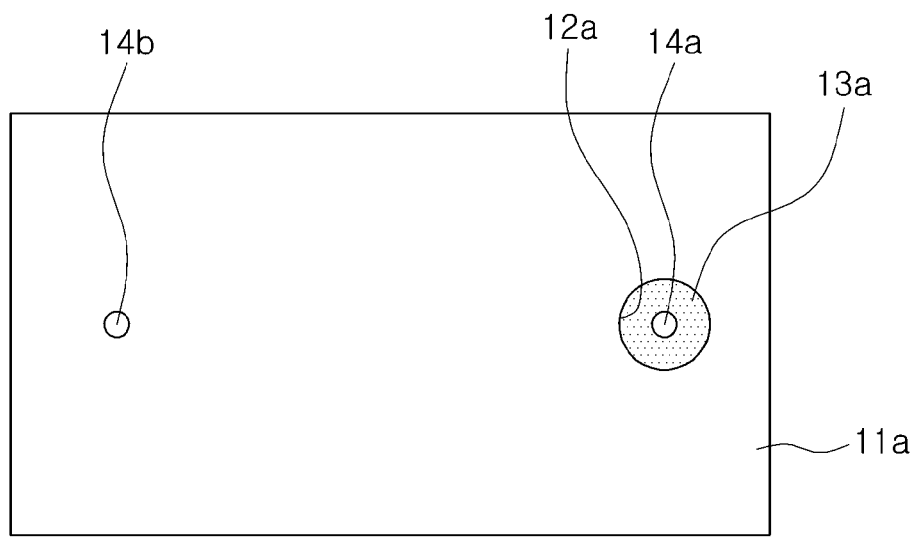
FIGS. 3A and 3B, 4A and 4B, and 5A and 5B are plan views of internal electrodes for a piezoelectric device according to an embodiment of the present invention.
Figure 3B:
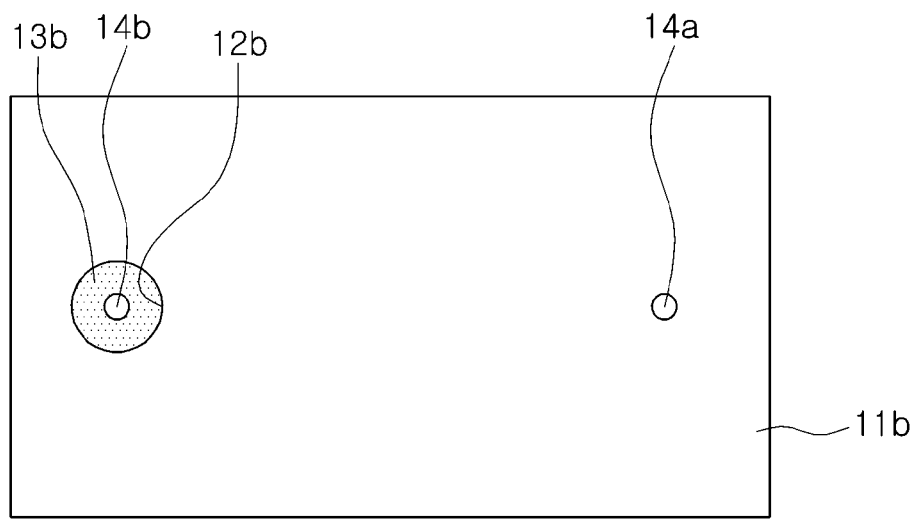

Referring to FIGS. 3A and 3B, the insulating vias 12a and 12b, depending on their polarities, may be alternated in the stacking direction such that they are staggered in the longitudinal direction (x direction). However, the present invention is not limited thereto.

Figure 4A:
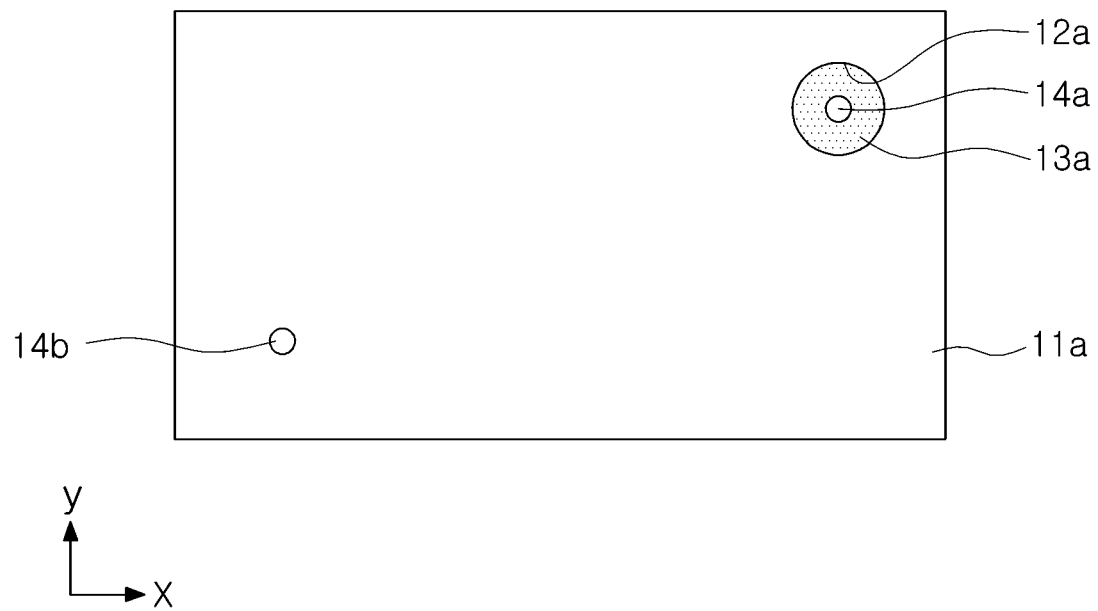
Figure 4B:
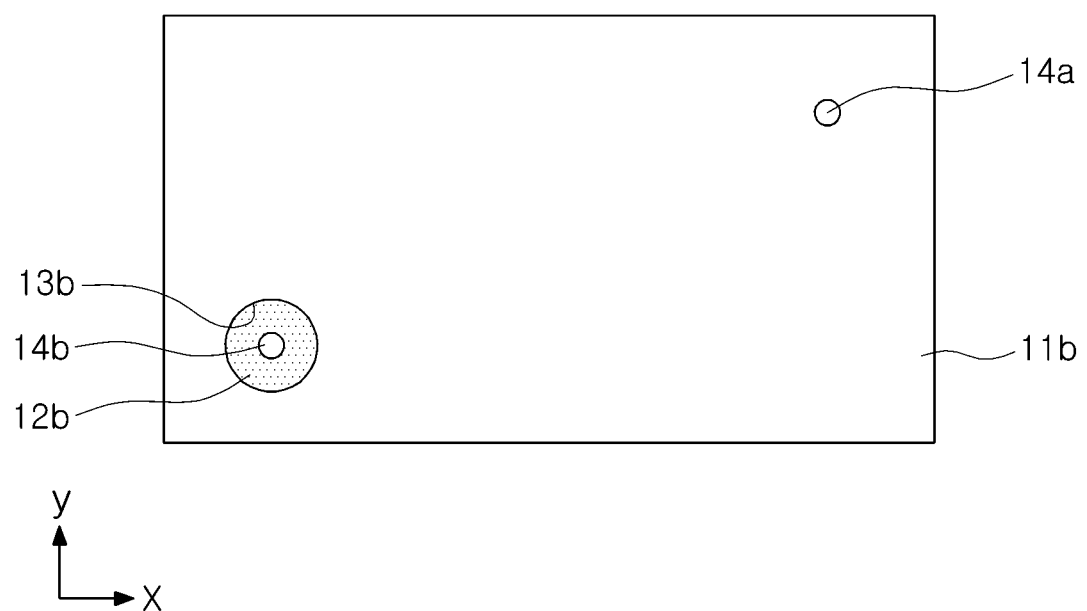

Referring to FIGS. 4A and 4B, the insulating vias 12a and 12b, depending on their polarities, may be alternated in the stacking direction such that they are staggered at corners. However, the present invention is not limited thereto.

Figure 5A:
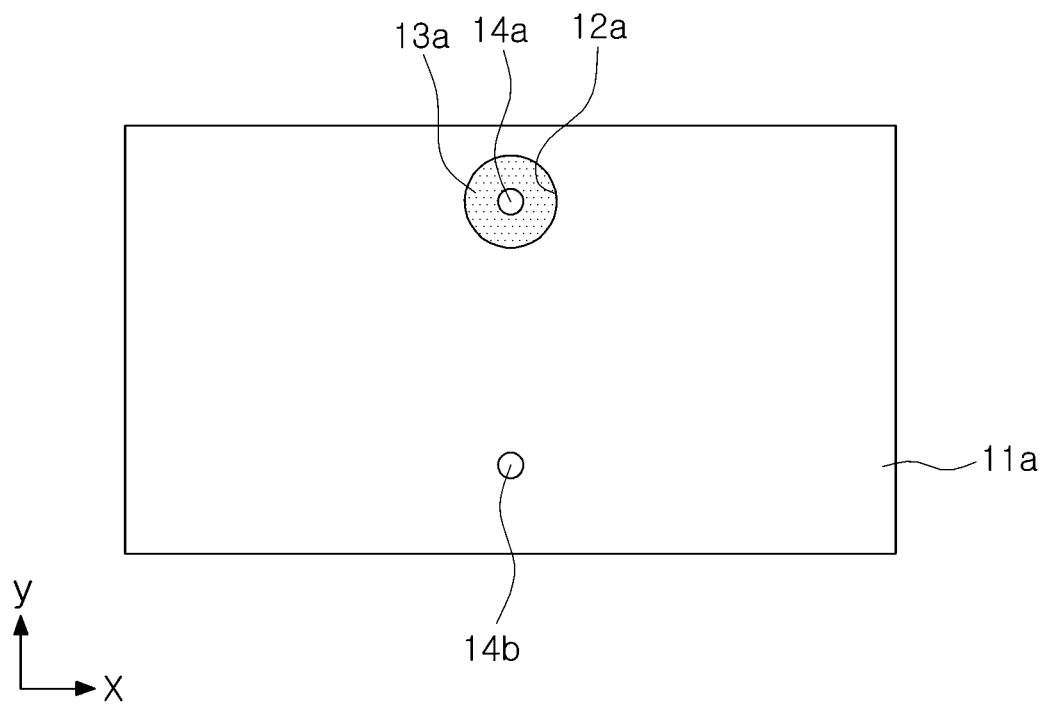
Figure 5B:
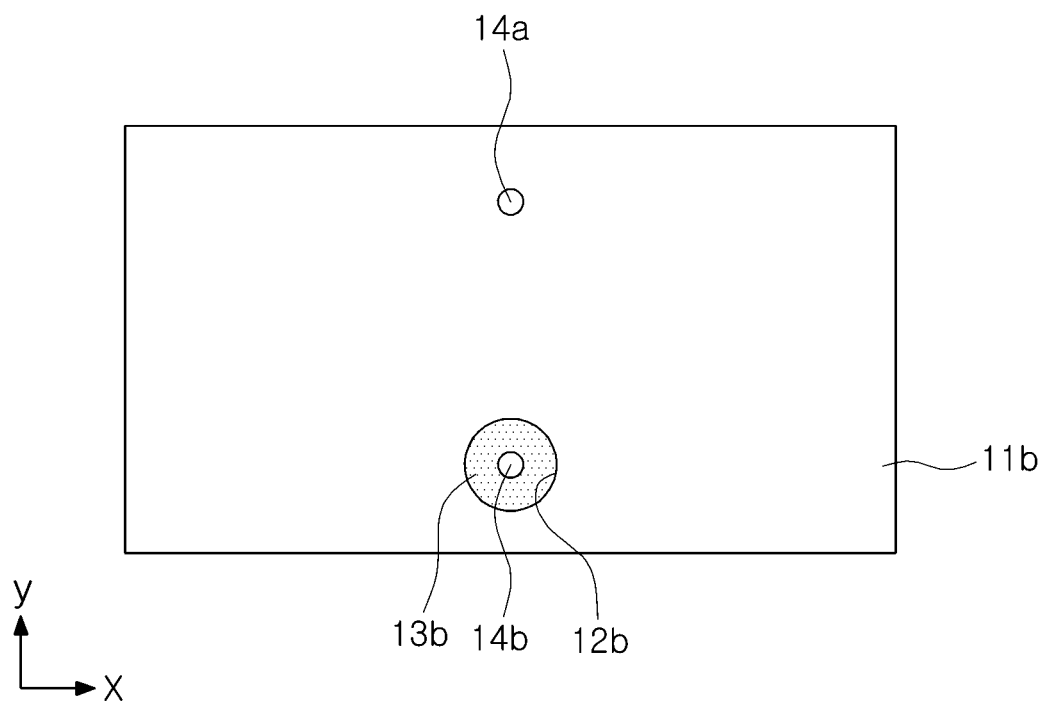

Referring to FIGS. 5A and 5B, the insulating vias 12a and 12b, depending on their polarities, may alternate in the stacking direction such that they are staggered in the width direction (y direction). However, the present invention is not limited thereto.

That is, in the internal electrode for a piezoelectric device according to an embodiment of the present invention, the positions of the insulating vias 12a and 12b may be changed as desired, and thus the positions of external electrodes may be freely determined.

Figure 6:
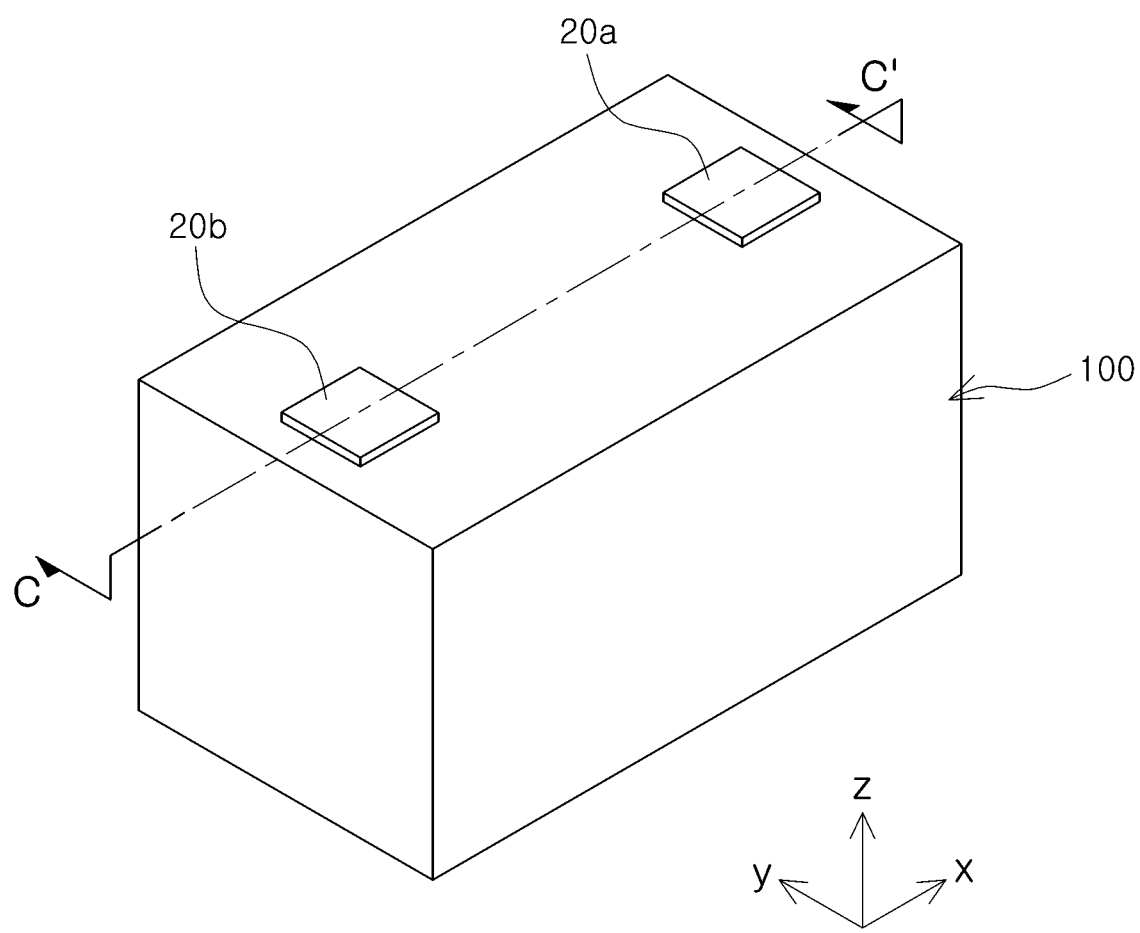
FIG. 6 is a perspective view schematically illustrating a piezoelectric device according to another embodiment of the present invention.
Figure 7:
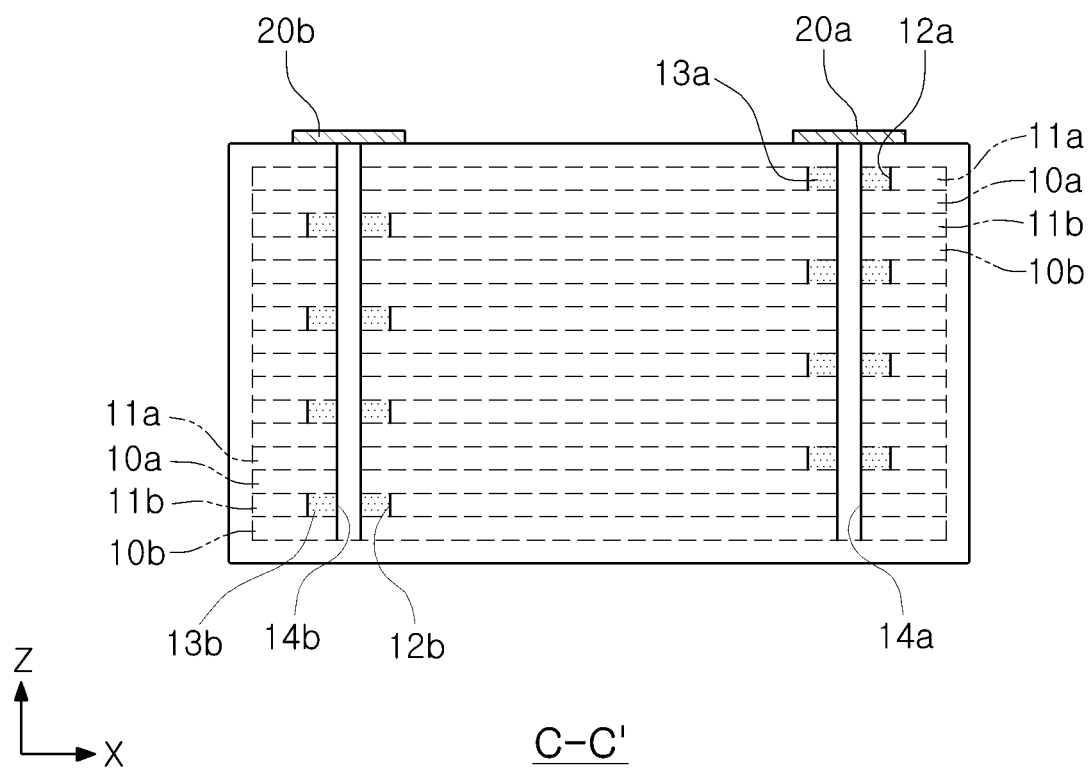
FIG. 7 is a schematic cross-sectional view taken along line C-C' of FIG. 6.

FIG. 6 is a perspective view schematically illustrating a piezoelectric device according to another embodiment of the present invention, and FIG. 7 is a schematic cross-sectional view taken along line C-C' of FIG. 6.

Referring to FIGS. 6 and 7, a piezoelectric device according to another embodiment of the present invention may include a multilayered body 100 in which a piezoelectric layer 10a having a first internal electrode 11a formed thereon and a piezoelectric layer 10b having a second internal electrode 11b formed thereon are alternately formed; a first insulating via 12a formed on the first internal electrode layer 11a; a second insulating via 12b formed on the second internal electrode layer 11b; a first conductive via 14a formed in the multilayered body 100 and penetrating through the first insulating via 12a; and a second conductive via 14b formed in the multilayered body 100 and penetrating through the second insulating via 12b, wherein a diameter of the first insulating via 12a is larger than a diameter of the first conductive via 14a, and a diameter of the second insulating via 12b is larger than a diameter of the second conductive via 14b.

The piezoelectric device according to another embodiment of the present invention may further include a first external electrode 20a electrically connected to the first conductive via 14a, and a second external electrode 20b electrically connected to the second conductive via 14b.

The first and second conductive via 14a and 14b may be filled with conductive material, and may electrically connect the first and second external electrodes 20a and 20b to the internal electrodes 11b and 11a, respectively.

The structure of the piezoelectric device according to the another embodiment of the present invention will be described under the assumption that a positive voltage is applied to the first internal electrode layer 11a and a negative voltage is applied to the second internal electrode layer 11b.

In order to apply a positive voltage to the first internal electrode layer 11a, a positive voltage needs to be applied to the second conductive via 14b.

That is, since no space or material for blocking the electrical connection between the second conductive via 14b and the first internal electrode layer 11a exists, the first internal electrode layer 11a may be electrically connected to the second external electrode 20b by the second via 14b formed in the first internal electrode layer 11a.

On the contrary, the first conductive via 14a formed in the first internal electrode layer 11a is not electrically connected to the first internal electrode layer 11a since the insulating via 12a is formed therebetween.

In order to apply a negative voltage to the second internal electrode layer 11b, a negative voltage needs to be applied to the first conductive via 14a.

That is, since no space or material for blocking the electrical connection between the first conductive via 14a and the second internal electrode layer 11b exists, the second internal electrode layer 11b may be electrically connected to the first external electrode 20a by the first conductive via 14a formed in the second internal electrode layer 11b.

On the contrary, the second conductive via 14b formed in the second internal electrode layer 11b is not electrically connected to the second internal electrode layer 11b since the insulating via 12b is formed therebetween.

In the piezoelectric device according to the another embodiment of the present invention, the percentage of the overlapping area of the first internal electrode layer 11a and the second internal electrode layer 11b may be from 80 to 99%.

The piezoelectric device may maximize its active region by using the first and second conductive vias 14a and 14b to obtain 80 to 99% of an overlapping area of the first internal electrode layer 11a and the second internal electrode layer 11b.

That is, as the inactive area of the piezoelectric device is minimized, the performance of the piezoelectric device may be maximized.

Figure 8:
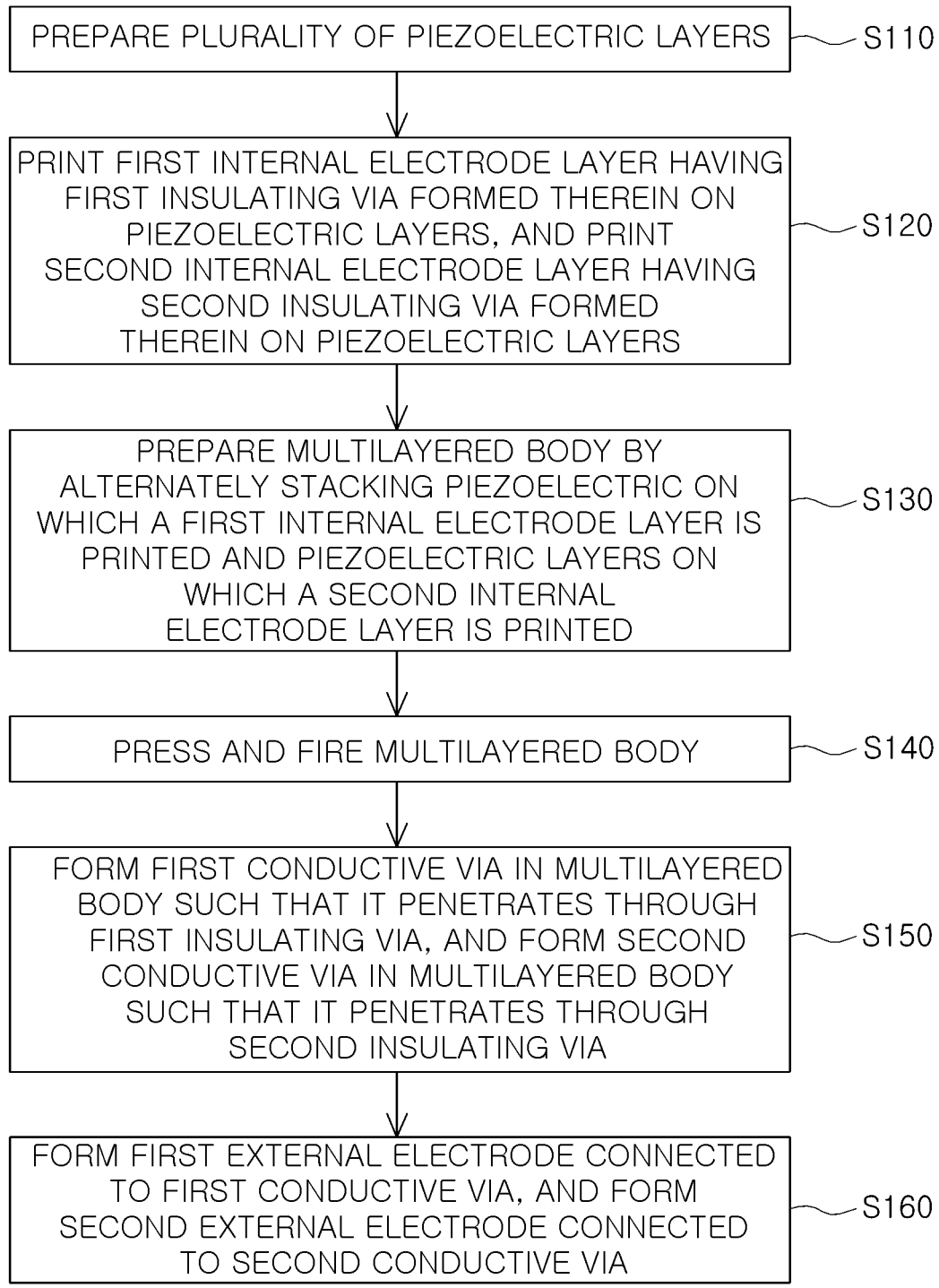
FIG. 8 is a flowchart illustrating a method of manufacturing a piezoelectric device according to another embodiment of the present invention.

FIG. 8 is a flowchart illustrating a method of manufacturing a piezoelectric device according to another embodiment of the present invention.

A method of manufacturing a piezoelectric device according to another embodiment of the present invention may include preparing a plurality of piezoelectric layers 10a and 10b (S110); printing a first internal electrode layer 11a having a first insulating via 12a formed therein on the piezoelectric layers 10a, and printing a second internal electrode layers 12b having a second insulating via 12b formed therein on the piezoelectric layers 10b (S120); preparing a multilayered body 100 by alternately stacking the piezoelectric layer 10a on which the first internal electrode layer 11a is printed and the piezoelectric layer 10b on which the second internal electrode layer 11b is printed (S130); pressing and firing the multilayered body 100 (S140); and forming a first conductive via 14a in the multilayered body 100 such that it penetrates through the first insulating via 12a, and forming a second conductive via 14b in the multilayered body 100 such that it penetrates through the second insulating via 12b (S150), wherein a diameter of the first insulating via 12a is larger than a diameter of the first conductive via 14a, and a diameter of the second insulating via 12b is larger than a diameter of the second conductive via 14b.

The method of manufacturing the piezoelectric device according to another embodiment will be described in detail.

Initially, the preparing S110 of the plurality of piezoelectric layers 10a and 10b may be performed by pressing a piezoelectric material into a sheet.

The piezoelectric material may be made of a material which exhibits the piezoelectric effect.

The piezoelectric effect means that electric polarization occurs in response to applied external pressure so that a potential difference occurs, and in reverse, mechanical deformation or mechanical stress is generated in response to an applied voltage.

The piezoelectric layers 10a and 10b may be at least one selected from a group consisting of crystal, tourmaline, Rochelle salt, barium titanate, monoammonium phosphate, tartaric acid ethylene diamine or the like, or a mixture thereof.

Subsequently, printing S120 of the first internal electrode layer 11a having the first insulating via 12a formed therein onto the piezoelectric layer 10a and of the second internal electrode layer 11b having the second insulating via 12b formed therein onto the piezoelectric layer 10b may be performed by forming each of the internal electrodes on the piezoelectric layer using a screen printing method or gravure printing method.

In some embodiments, the printing S120 of the first and second internal electrode layers 11a and 11b may include forming the first and second insulating layers 13a and 13b around the first and second insulating vias 12a and 12b, respectively.

The insulating layers 13a and 13b may be made of the same material as the piezoelectric layers, and serve to prevent cracks due to the difference in thermal expansion coefficients of the materials during the later firing of the multilayered body.

After forming of the internal electrodes on the piezoelectric layers, preparing S130 the multilayered body 100 by alternately stacking the piezoelectric layer 10a on which the first internal electrode layer 11a is printed and the piezoelectric layer 10b on which the second internal electrode layer 11b is printed, and pressing and firing S140 the multilayered body 100 may be performed in this order.

Then, the forming S150 of the first conductive via 14a in the multilayered body 100 so that first conductive via 14a penetrates through the first insulating via 12a and of the second conductive via 14b in the multilayered body 100 so that second conductive via 14b penetrates through the second insulating via 12b may be performed.

By virtue of the first insulating via 12a formed in the first internal electrode layer 11a, the first conductive via 14a and the first internal electrode layer 11a are not electrically connected. By virtue of the second insulating via 12b formed in the second internal electrode layer 11b, the second conductive via 14b and the second internal electrode layer 11b are not electrically connected.

The forming S150 of the first and second conductive vias 14a and 14b may include forming vias in the multilayered body 100 using a laser and then filling the vias with a conductive material.

In some embodiments, after the forming S150 of the first and second conductive vias 14a and 14b, the method may further include forming S160 the first external electrode 20a connected to the first conductive via 14a and the second external electrode 20b connected to the second conductive via 14b.

The first internal electrode 11a may be electrically connected to the second external electrode 20b via the second conductive via 14b, and the second internal electrode 11b may be electrically connected to the first external electrode 20a via the first conductive via 14a.

As set forth above, according to embodiments of the present invention, the internal electrode for a piezoelectric device can have maximized effective area for the piezoelectric layer by forming an insulating via having larger diameter than that of the conductive via.

Further, the piezoelectric device according to another embodiment can maximize its performance using the internal electrode for a piezoelectric device.

While the present invention has been shown and described in connection with the embodiments, it will be apparent to those skilled in the art that modifications and variations can be made without departing from the spirit and scope of the invention as defined by the appended claims.

What is claimed is:

1. An internal electrode for a piezoelectric device, comprising:
    a piezoelectric layer;
    an internal electrode formed on the piezoelectric layer;
    an insulating via formed in the internal electrode; and
    a conductive via formed in the central portion of the insulating via,
    wherein a diameter of the insulating via is larger than a diameter of the conductive via.

2. The electrode of claim 1, wherein a ratio of the diameter of the conductive via to the diameter of the insulating via ranges from 0.5 to 0.75.

3. The electrode of claim 1, further comprising an insulating layer formed around the insulating via.

4. The electrode of claim 3, wherein the insulating layer is made of a ferroelectric material including at least one element among Pb, Zr and Ti.

5. The electrode of claim 1, wherein the insulating via is at least formed on one of one side of the internal electrode in the longitudinal direction thereof, one side of the internal electrode in the width direction thereof or in a corner thereof.

6. A piezoelectric device, comprising:
    a multilayered body in which a piezoelectric layer having a first internal electrode formed thereon and a piezoelectric layer having a second internal electrode formed thereon are alternately formed;
    a first insulating via formed in the first internal electrode layer;
    a second insulating via formed in the second internal electrode layer;
    a first conductive via formed in the multilayered body and penetrating through the first insulating via; and
    a second conductive via formed in the multilayered body and penetrating through the second insulating via,
    wherein a diameter of the first insulating via is larger than a diameter of the first conductive via, and a diameter of the second insulating via is larger than a diameter of the second conductive via.

7. The device of claim 6, wherein a ratio of the diameter of the first conductive via to the diameter of the first insulating via ranges from 0.5 to 0.75 or a ratio of the diameter of the second conductive via to the diameter of the second insulating via ranges from 0.5 to 0.75.

8. The device of claim 6, further comprising an insulating layer formed around the first insulating via or the second insulating via.

9. The device of claim 8, wherein the insulating layer is made of the same material as that of the piezoelectric layer.

10. The device of claim 8, wherein the insulating layer is made of a ferroelectric material including at least one element among Pb, Zr and Ti.

11. The device of claim 6, wherein the percentage of an overlapping area of the first internal electrode layer and the second internal electrode layer is from 80 to 99%.

12. The device of claim 6, wherein the first and second conductive vias are filled with a conductive material.

13. A method of manufacturing a piezoelectric device, comprising:

preparing a plurality of piezoelectric layers;
printing a first internal electrode layer having a first insulating via formed therein on some of the piezoelectric layers, and printing a second internal electrode layer having a second insulating via formed therein on the other of the piezoelectric layers;
preparing a multilayered body by alternately stacking the piezoelectric layer on which the first internal electrode is printed and the piezoelectric layer on which the second internal electrode is printed;
pressing and firing the multilayered body; and
forming a first conductive via in the multilayered body such that it penetrates through the first insulating via, and forming a second conductive via in the multilayered body such that it penetrates through the second insulating via,
wherein a diameter of the first insulating via is larger than a diameter of the first conductive via, and a diameter of the second insulating via is larger than a diameter of the second conductive via.

14. The method of claim 13, wherein the printing of the first and second internal electrodes includes forming insulating layers around the first and second insulating vias.

15. The method of claim 14, wherein the insulating layer is made of the same material as that of the piezoelectric layer.

16. The method of claim 14, wherein the insulating layer is made of a ferroelectric material including at least one element among Pb, Zr and Ti.

17. The method of claim 13, further comprising, after the forming of the first and second conductive vias, forming a first external electrode connected to the first conductive via, and forming a second external electrode connected to the second conductive via.

18. The method of claim 13, wherein a ratio of the diameter of the first conductive via to the diameter of the first insulating via ranges from 0.5 to 0.75 or a ratio of the diameter of the second conductive via to the diameter of the second insulating via ranges from 0.5 to 0.75.

* * * * *